United States Patent
Chen (10) Patent No.: US 9,929,241 B2
(45) Date of Patent: Mar. 27, 2018

(54) SEMICONDUCTOR DEVICE STRUCTURE FOR IMPROVED PERFORMANCE AND RELATED METHOD

(71) Applicant: Infineon Technologies Americas Corp., El Segundo, CA (US)

(72) Inventor: Jingjing Chen, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 26 days.

(21) Appl. No.: 15/015,021

(22) Filed: Feb. 3, 2016

(65) Prior Publication Data
US 2017/0222002 A1    Aug. 3, 2017

(51) Int. Cl.
| | | |
|---|---|---|
| H01L 21/8234 | (2006.01) | |
| H01L 29/423 | (2006.01) | |
| H01L 29/78 | (2006.01) | |
| H01L 29/66 | (2006.01) | |
| H01L 29/10 | (2006.01) | |
| H01L 21/283 | (2006.01) | |
| H01L 29/08 | (2006.01) | |
| H01L 29/417 | (2006.01) | |

(52) U.S. Cl.
CPC ........ *H01L 29/4236* (2013.01); *H01L 21/283* (2013.01); *H01L 29/0865* (2013.01); *H01L 29/0882* (2013.01); *H01L 29/1095* (2013.01); *H01L 29/41725* (2013.01); *H01L 29/42356* (2013.01); *H01L 29/66704* (2013.01); *H01L 29/7813* (2013.01)

(58) Field of Classification Search
CPC ......... H01L 21/823456; H01L 29/4238; H01L 29/7813; H01L 29/7831
See application file for complete search history.

(56) References Cited

U.S. PATENT DOCUMENTS

2014/0374818 A1* 12/2014 Jin ...................... H01L 29/7802
                                                              257/329
2015/0162328 A1*  6/2015 Wang .................. H01L 29/7827
                                                              257/334

FOREIGN PATENT DOCUMENTS

WO       WO 2012106834 A1 *  8/2012    ....... H01L 29/42376

* cited by examiner

*Primary Examiner* — Thomas L Dickey
(74) *Attorney, Agent, or Firm* — Murphy, Bilak & Homiller, PLLC (57) ABSTRACT

A semiconductor device includes a vertical gate electrode in a gate trench in a semiconductor substrate, and a lateral gate electrode over the semiconductor substrate and adjacent the gate trench, where the lateral gate electrode results in improved electrical performance of the semiconductor device. The improved electrical performance includes an improved avalanche current tolerance in the semiconductor device. The improved electrical performance includes a reduced impact ionization under the gate trench. The improved electrical performance includes a reduced electric field under the gate trench. The lateral gate electrode results in an improved thermal stability in the semiconductor device.

11 Claims, 11 Drawing Sheets

SEMICONDUCTOR DEVICE STRUCTURE FOR IMPROVED PERFORMANCE AND RELATED METHOD

BACKGROUND

Power semiconductor devices, such as power metal oxide semiconductor field effect transistors (MOSFETs), have been widely used in power switching devices, such as power supplies, rectifiers, low-voltage motor controllers, or so forth. Power semiconductor devices can be made with a trench topology to improve power density.

In conventional trench type semiconductor devices, as the power density continues to increase, the current that could be made to flow and the power thus generated far exceeds the heat-dissipative capability of the substrate material, such as silicon. As such, the conventional trench type semiconductor devices have shown a propensity for thermal instability and raised concerns for suitability of these devices for linear operation. For instance, forward biased safe operating area (FBSOA) failures can be mainly attributed to localized thermal runaway caused by hot spotting. As an example, when a semiconductor device is operated below the zero temperature coefficient point (ZTCP), if a local region gets hot, the threshold voltage will drop leading to a stronger gate drive and causing the current to rise. This rising current in turn generates more heat in the local region, which further drives down the threshold voltage.

In addition, electrical performance characteristics, such as avalanche ruggedness and electric field crowding, associated with trench type semiconductor devices are also impacted as the power density continues to increase. An avalanche condition can occur when a high voltage is applied across a drain to a source of a trench type semiconductor device. In the avalanche condition, impact ionization of electron-hole pairs can generate avalanche current between a drain of the semiconductor device and a base of the semiconductor device. The avalanche ruggedness of a semiconductor device characterizes the semiconductor device's capability to withstand the avalanche current when subjected to unclamped inductive switching. As dimensions of the trench type semiconductor devices continue to decrease, the electrical performance characteristics, such as avalanche ruggedness and electric field crowding, are also negatively impacted.

Accordingly, there is a need to overcome the drawbacks and deficiencies in the art by providing a semiconductor device with improved thermal stability and electrical performance characteristics.

SUMMARY

The present application is directed to a semiconductor device structure for improved performance and related method, substantially as shown in and/or described in connection with at least one of the figures, and as set forth in the claims.

DETAILED DESCRIPTION

The following description contains specific information pertaining to implementations in the present application. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
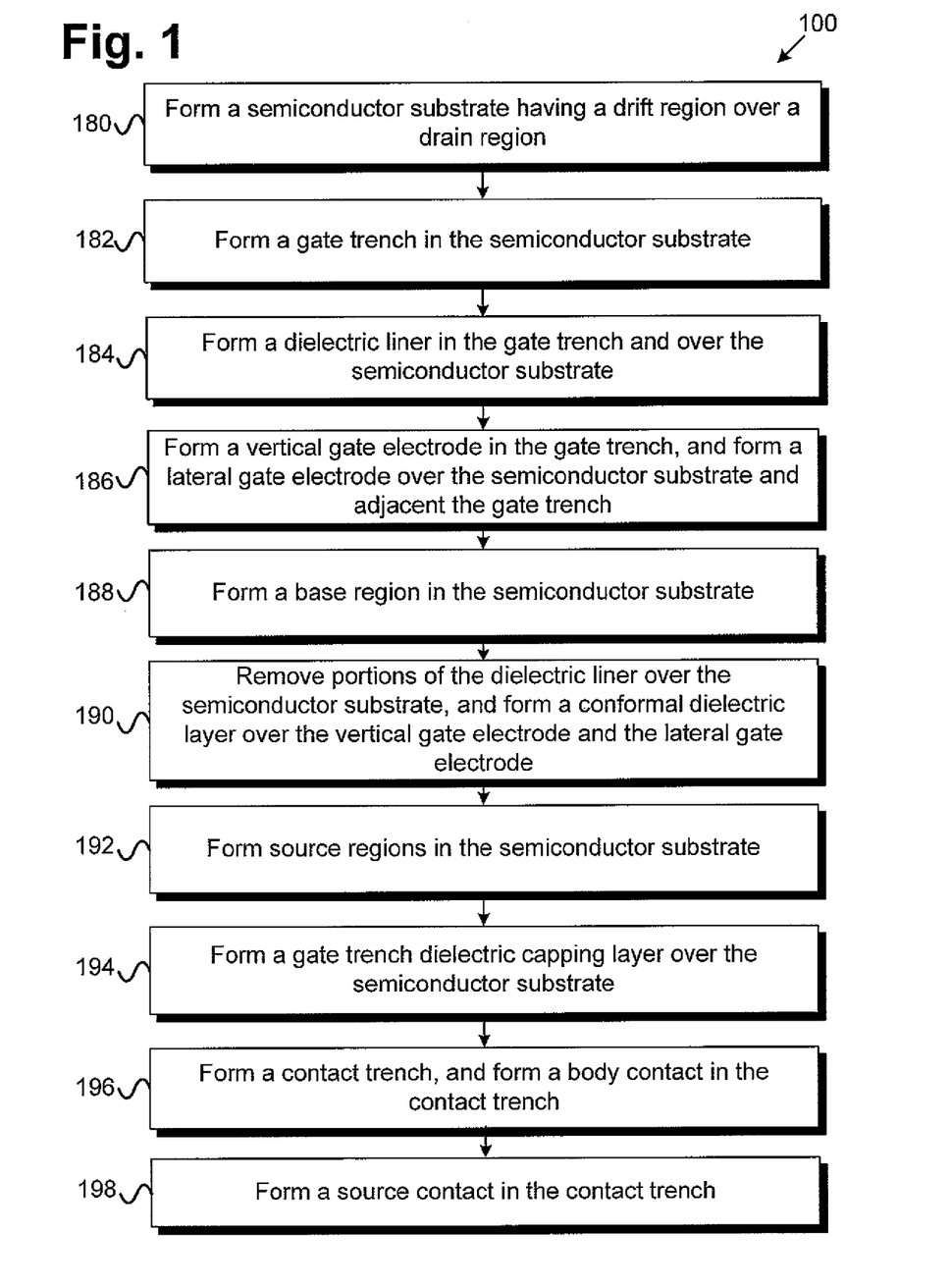
FIG. 1 is a flowchart illustrating a method of forming a semiconductor structure according to one implementation of the present application.

FIG. 1 shows a flowchart illustrating an exemplary method of forming an exemplary semiconductor device according to an implementation of the present application. Certain details and features have been left out of the flowchart that are apparent to a person of ordinary skill in the art. For example, an action may consist of one or more subactions or may involve specialized equipment or materials, as known in the art. Actions 180, 182, 184, 186, 188, 190, 192, 194, 196 and 198 indicated in flowchart 100 are sufficient to describe one implementation of the present inventive concepts, other implementations of the present inventive concepts may utilize actions different from those shown in flowchart 100. Moreover, semiconductor structures 280, 282, 284, 286, 288, 290, 292, 294, 296 and 298 in FIGS. 2A, 2B, 2C, 2D, 2E, 2F, 2G, 2H, 2I and 2J illustrate the results of performing actions 180, 182, 184, 186, 188, 190, 192, 194, 196 and 198 of flowchart 100, respectively. For example, semiconductor structure 280 is an exemplary structure of a portion of a semiconductor device after processing action 180, semiconductor structure 282 is an exemplary structure of a portion of a semiconductor device after the processing of action 182, semiconductor structure 284 is an exemplary structure of a portion of a semiconductor device after the processing of action 184, and so forth.

Figure 2A:
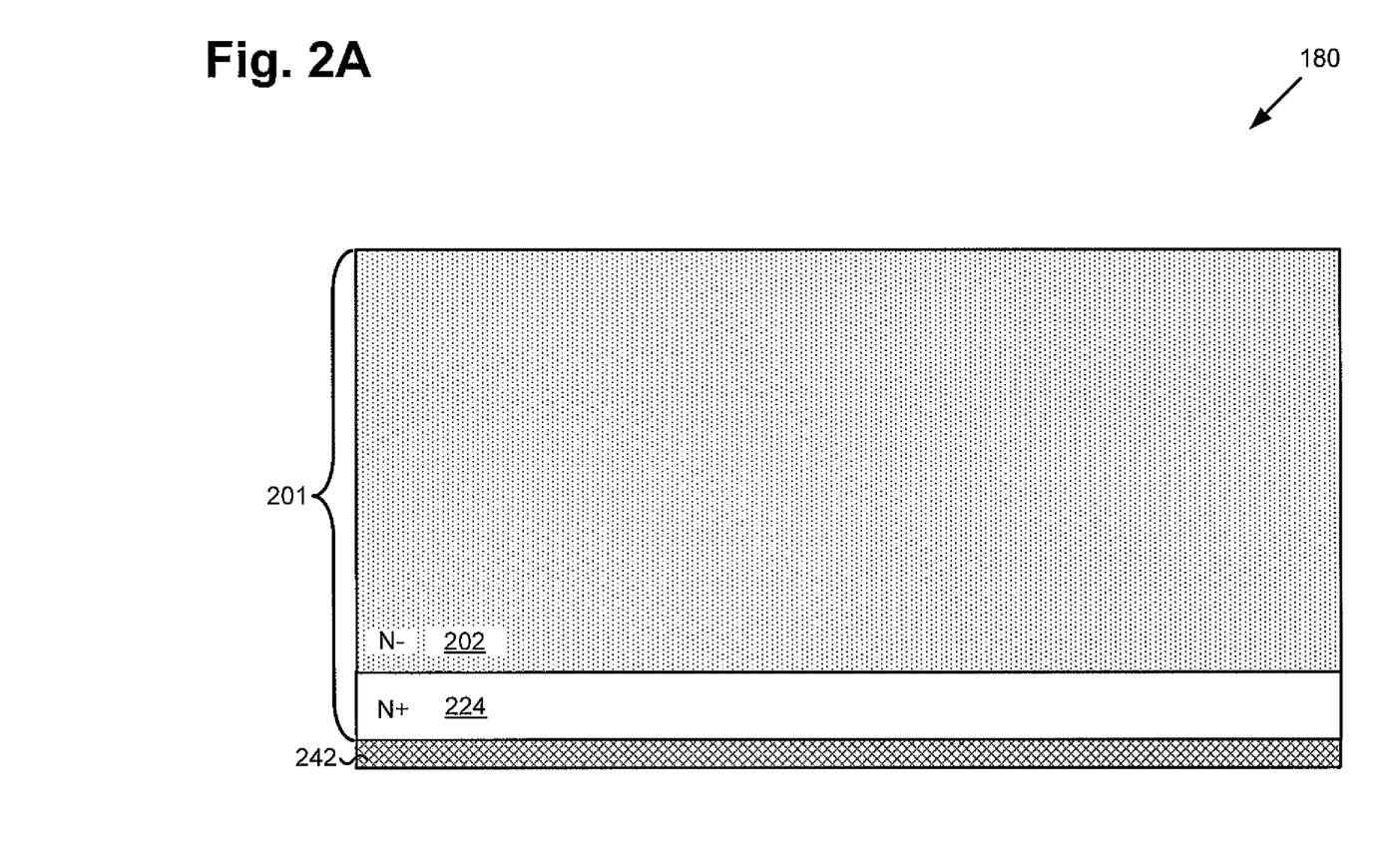
FIG. 2A illustrates a cross-sectional view of a portion of a semiconductor structure processed in accordance with an initial action in the flowchart of FIG. 1 according to one implementation of the present application.

Referring to action 180 in FIG. 1 and semiconductor structure 280 in FIG. 2A, action 180 includes forming a semiconductor substrate having a drift region over a drain region. Referring to FIG. 2A, semiconductor structure 280 illustrates a cross-sectional view of a portion of a semiconductor structure after completion of action 180 in flowchart 100 of FIG. 1, according to one implementation of the present application. As illustrated in FIG. 2A, semiconductor structure 280 includes semiconductor substrate 201, which includes drift region 202 situated over drain region 224. Semiconductor substrate 201 may include any suitable semiconductor material, such as silicon.

As illustrated in FIG. 2A, drain region 224 is of a first conductivity type, and is shown as having N+ conductivity by way of example. In the present implementation, drain region 224 includes a highly doped semiconductor material as a drain of a semiconductor device, such as a power MOSFET or an insulated gate bipolar transistor (IGBT). In the present implementation, drain region 224 may include an N type dopant, such as phosphorus or arsenic. In another implementation, drain region 224 may include a P type dopant, such as boron. Drain contact 242 is formed at the bottom of drain region 224.

As illustrated in FIG. 2A, drift region 202 is of the first conductivity type, and is shown as having N conductivity by way of example. In an implementation, drift region 202 may include any suitable semiconductor material that can be epitaxially grown (e.g., epitaxial layer) on drift region 202. For example, drift region 202 may include epitaxial silicon grown on drain region 224. In an implementation, drift region 202 can be intrinsically or pre-doped to be an N type material, or can be subsequently doped to become an N type material, for example. In the present implementation, drift region 202 may include an N type dopant, such as phosphorus or arsenic. In another implementation, drift region 202 may include a P type dopant, such as boron.

Figure 2B:
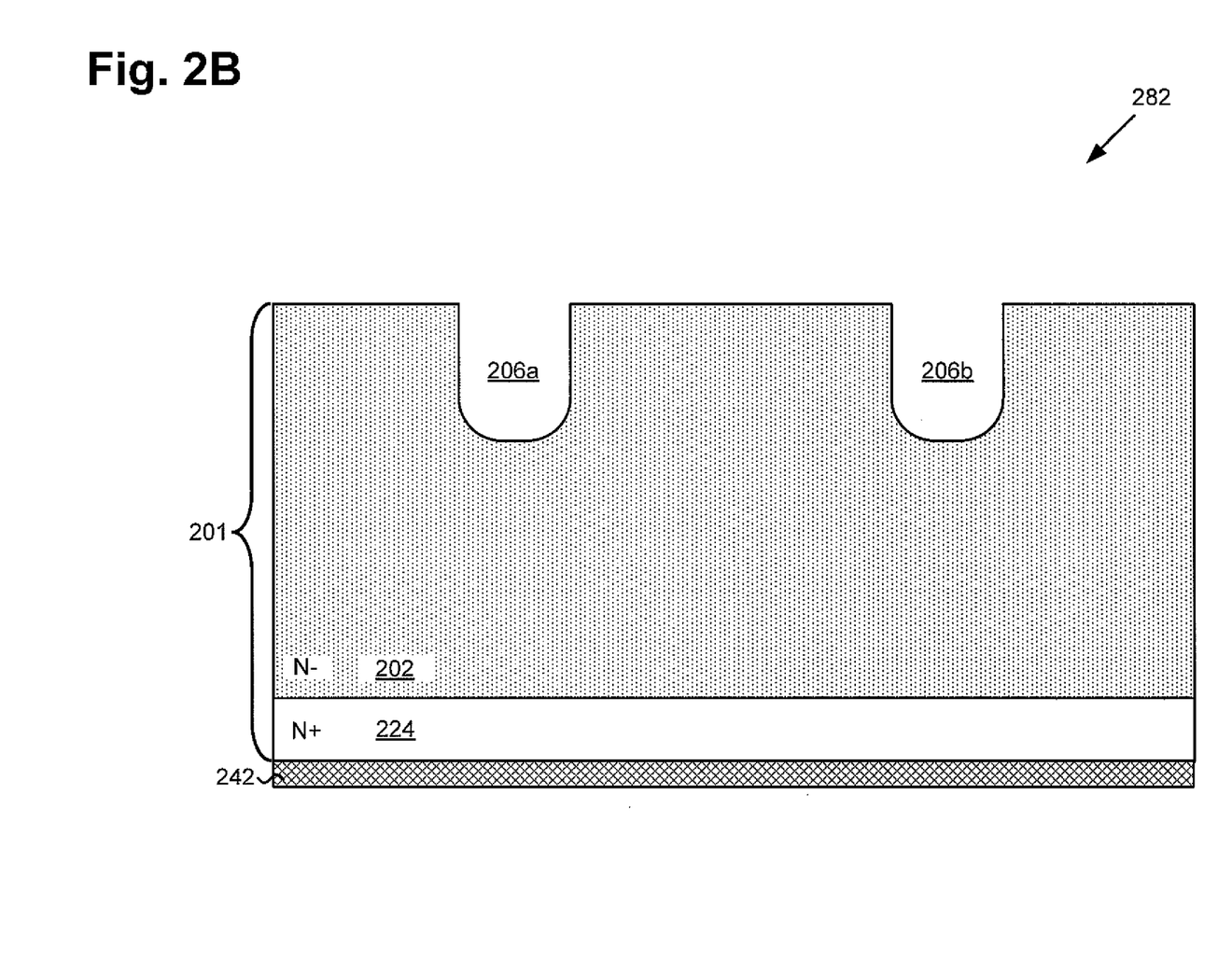
FIG. 2B illustrates a cross-sectional view of a portion of a semiconductor structure processed in accordance with an intermediate action in the flowchart of FIG. 1 according to one implementation of the present application.

Referring to action 182 in FIG. 1 and semiconductor structure 282 in FIG. 2B, action 182 includes forming a gate trench in the semiconductor substrate. Referring to FIG. 2B, semiconductor structure 282 illustrates a cross-sectional view of a portion of a semiconductor structure after completion of action 182 in flowchart 100 of FIG. 1, according to one implementation of the present application. As illustrated in FIG. 2B, semiconductor structure 282 includes gate trenches 206a and 206b in semiconductor substrate 201.

In the present implementation, gate trenches 206a and 206b may be formed by forming a patterned photoresist mask (not explicitly shown in FIG. 2B), and etching the unmasked regions of drift region 202 using, for example, an anisotropic etch. As illustrated in FIG. 2B, gate trenches 206a and 206b extend into drift region 202. Each of gate trenches 206a and 206b includes substantially parallel sidewalls extending into a bottom. In the present implementation, gate trenches 206a and 206b each include a U-shaped bottom. In another implementation, gate trenches 206a and 206b may each include sloped sidewalls and/or a flat bottom.

In the present implementation, gate trenches 206a and 206b may have a striped layout, where gate trenches 206a and 206b are substantially parallel to each another in semiconductor substrate 201. In another implementation, gate trenches 206a and 206b may have a cellular layout (e.g., in hexagonal, circular or square shapes) where gate trenches 206a and 206b are part of a continuous trench surrounding a source trench (not explicitly shown in FIG. 2B).

Figure 2C:
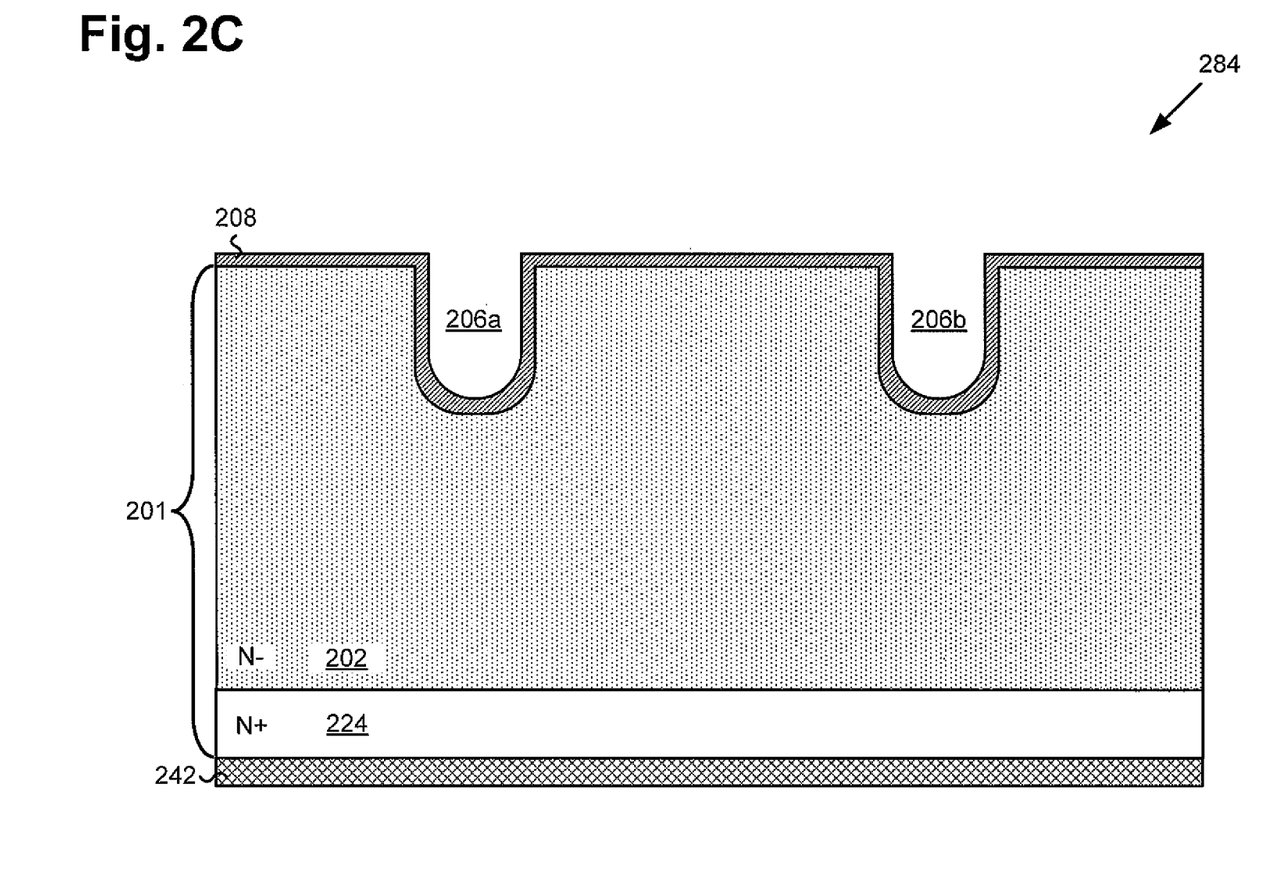
FIG. 2C illustrates a cross-sectional view of a portion of a semiconductor structure processed in accordance with an intermediate action in the flowchart of FIG. 1 according to one implementation of the present application.

Referring to action 184 in FIG. 1 and semiconductor structure 284 in FIG. 2C, action 184 includes forming a dielectric liner in the gate trench and over the semiconductor substrate. Referring to FIG. 2C, semiconductor structure 284 illustrates a cross-sectional view of a portion of a semiconductor structure after completion of action 184 in flowchart 100 of FIG. 1, according to one implementation of the present application. As illustrated in FIG. 2C, semiconductor structure 284 includes dielectric liner 208 in gate trenches 206a and 206b and over semiconductor substrate 201. Dielectric liner 208 lines the respective sidewalls and bottom of gate trenches 206a and 206b. Dielectric liner 208 is also disposed on a top surface of drift region 202 of semiconductor substrate 201. In the present implementation, dielectric liner 208 may include any suitable dielectric material, such as silicon oxide (e.g., $SiO_2$).

Figure 2D:
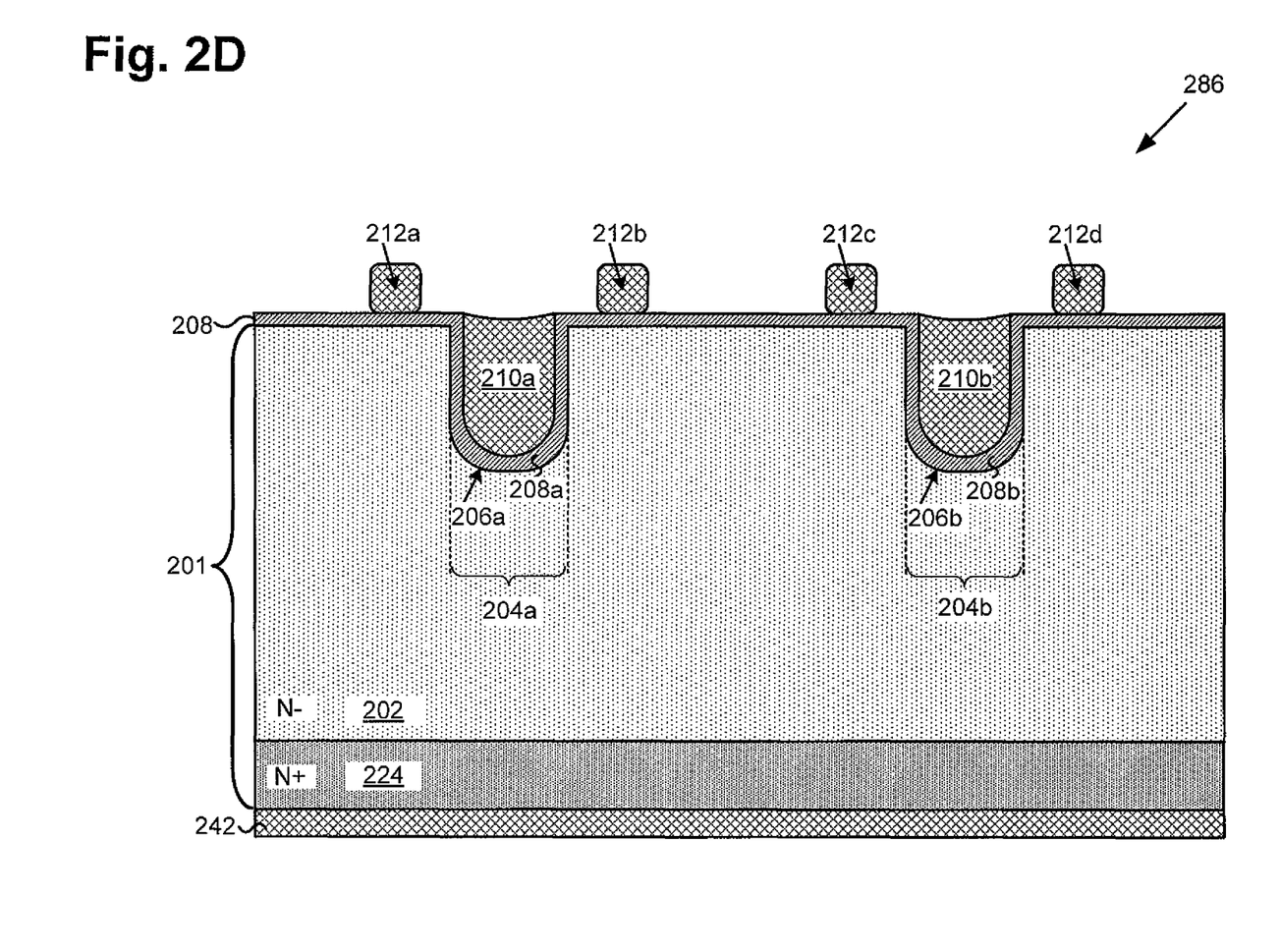
FIG. 2D illustrates a cross-sectional view of a portion of a semiconductor structure processed in accordance with an intermediate action in the flowchart of FIG. 1 according to one implementation of the present application.

Referring to action 186 in FIG. 1 and semiconductor structure 286 in FIG. 2D, action 186 includes forming a vertical gate electrode in the gate trench and forming a lateral gate electrode over the semiconductor substrate and adjacent the gate trench. Referring to FIG. 2D, semiconductor structure 286 illustrates a cross-sectional view of a portion of a semiconductor structure after completion of action 186 in flowchart 100 of FIG. 1, according to one implementation of the present application. As illustrated in FIG. 2D, semiconductor structure 286 includes vertical gate electrodes 210a and 210b in gate trenches 206a and 206b, respectively. Semiconductor structure 286 also includes lateral gate electrodes 212a, 212b, 212c and 212d situated on dielectric liner 208 over semiconductor substrate 201.

As illustrated in FIG. 2D, vertical gate electrodes 210a and 210b are formed over dielectric liner 208a and 208b, respectively, and fill the entire space in gate trenches 206a and 206b, respectively. As illustrated in FIG. 2D, lateral gate electrodes 212a, 212b, 212c and 212d are situated on dielectric liner 208 over semiconductor substrate 201. Lateral gate electrodes 212a and 212b are each adjacent (e.g., on each side of) gate trench 206a, while lateral gate electrodes 212c and 212d are each adjacent (e.g., on each side of) gate trench 206b.

In the present implementation, vertical gate electrodes 210a and 210b, and lateral gate electrodes 212a, 212b, 212c and 212d may be formed in the same processing action, and include the same conductive material. For example, vertical gate electrodes 210a and 210b, and lateral gate electrodes 212a, 212b, 212c and 212d may be formed by depositing conductive material in each of gate trenches 206a and 206b and on a top surface of dielectric liner 208 over semiconductor substrate 201, forming patterned masks over each of vertical gate electrodes 210a and 210b and lateral gate electrodes 212a, 212b, 212c and 212d, and removing the unmasked portions of the conductive material from semiconductor structure 286 by an etch back process, such as a gate poly etch back. In present implementation, vertical gate electrodes 210a and 210b, and lateral gate electrodes 212a, 212b, 212c and 212d include doped polycrystalline silicon. In another implementation, vertical gate electrodes 210a and 210b, and lateral gate electrodes 212a, 212b, 212c and 212d may include any suitable conductive material, such as metallic material. In another implementation, vertical gate electrodes 210a and 210b, and lateral gate electrodes 212a, 212b, 212c and 212d may be formed in separate processing actions and include different conductive materials.

Figure 2E:
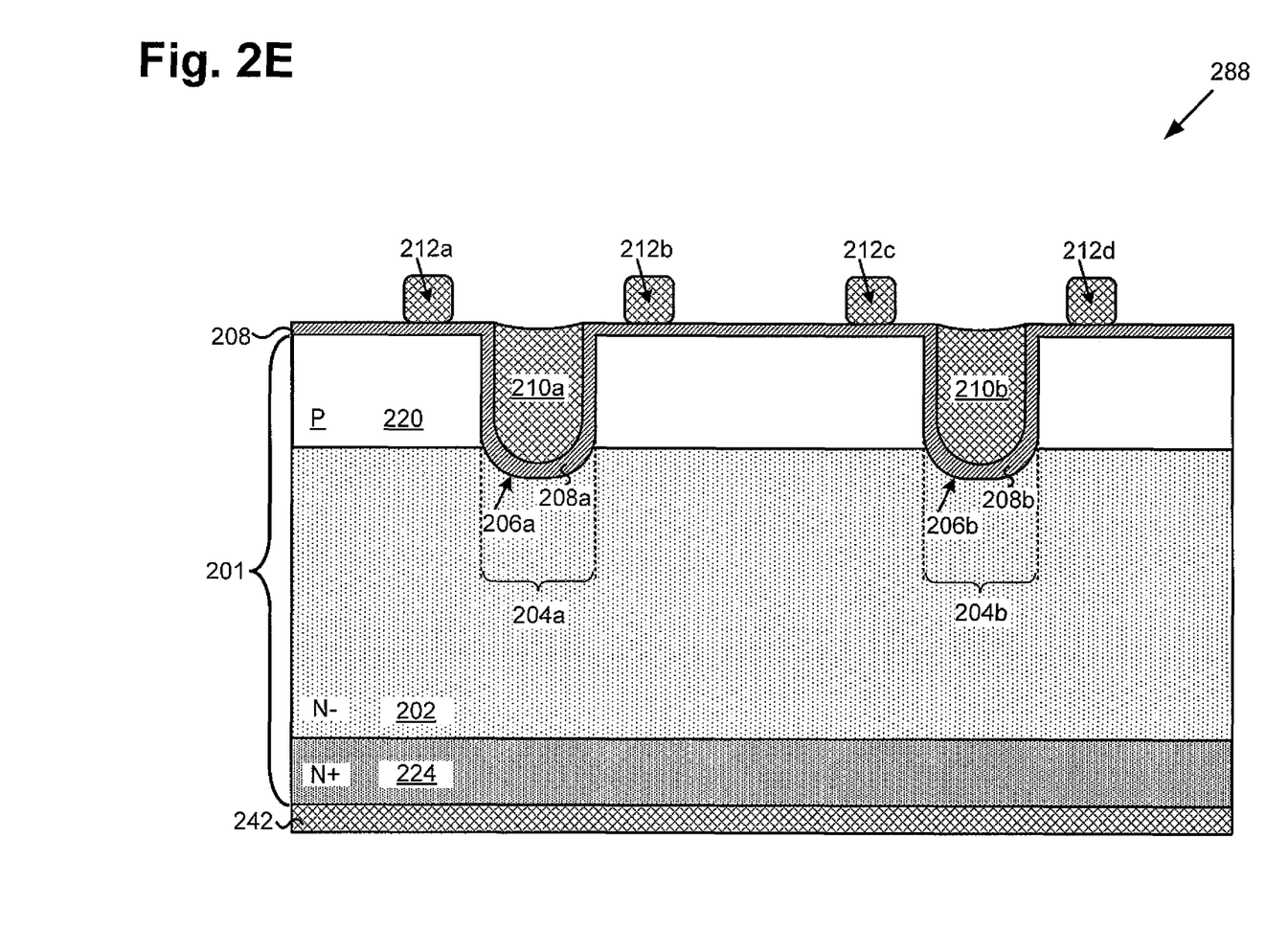
FIG. 2E illustrates a cross-sectional view of a portion of a semiconductor structure processed in accordance with an intermediate action in the flowchart of FIG. 1 according to one implementation of the present application.

Referring to action 188 in FIG. 1 and semiconductor structure 288 in FIG. 2E, action 188 includes a base region in the semiconductor substrate. Referring to FIG. 2E, semiconductor structure 288 illustrates a cross-sectional view of a portion of a semiconductor structure after completion of action 188 in flowchart 100 of FIG. 1, according to one implementation of the present application. As illustrated in FIG. 2E, semiconductor structure 288 includes base region 220 in semiconductor substrate 201. Base region 220 is situated in semiconductor substrate 201 and over drift region 202. In the present implementation, base region 220 is of a second conductivity type and are shown as having P conductivity by way of example. In the present implementation, base region 220 may be formed, for example, by doping semiconductor substrate 201 using a P type dopant, such as boron. In another implementation, base region 220 may be formed, for example, by doping semiconductor substrate 201 using an N type dopant, such as phosphorus or arsenic. As illustrated in FIG. 2E, gate trenches 206a and 206b, having respective vertical gate electrodes 210a and 210b, extend through base region 220 and into drift region 202.

Figure 2F:
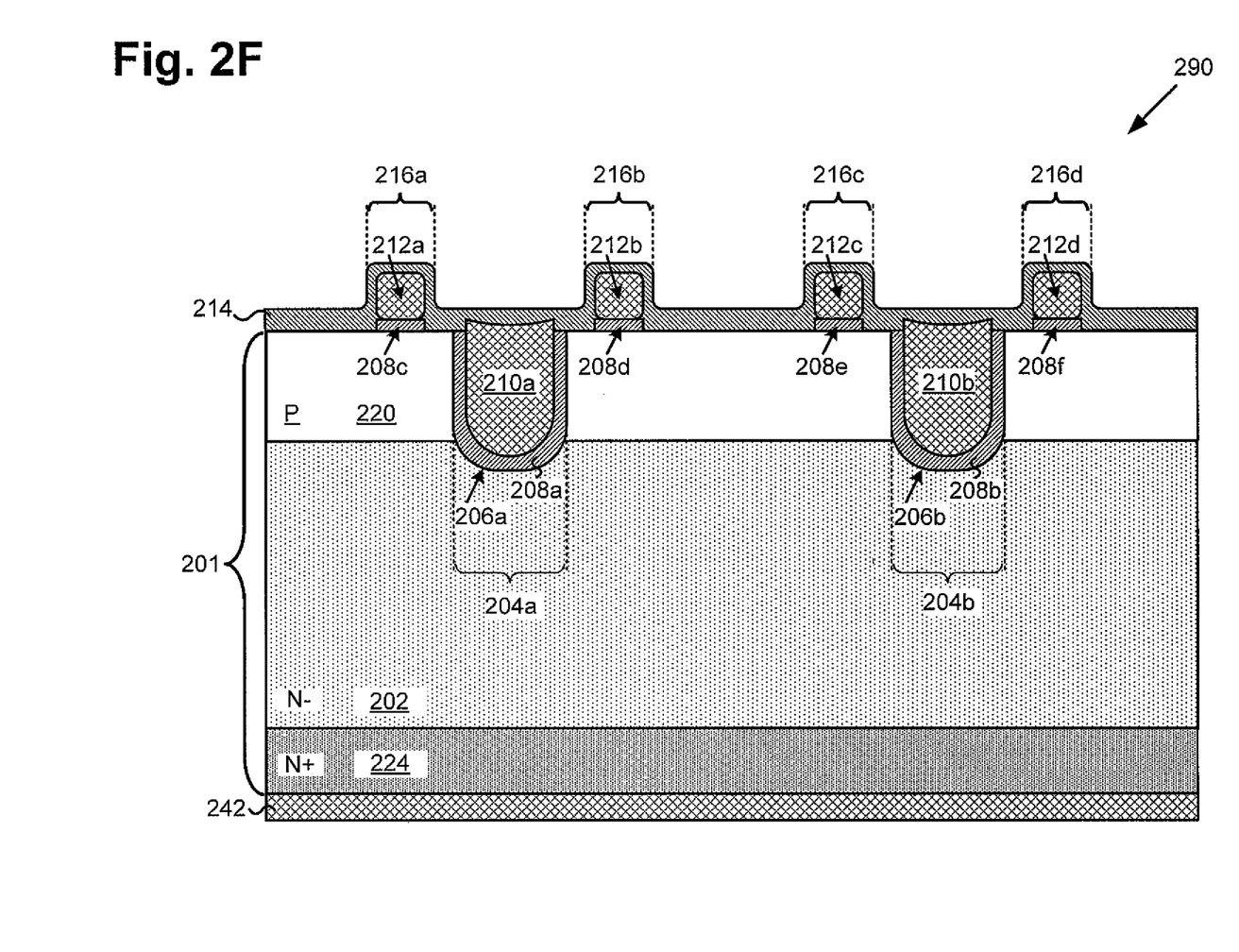
FIG. 2F illustrates a cross-sectional view of a portion of a semiconductor structure processed in accordance with an intermediate action in the flowchart of FIG. 1 according to one implementation of the present application.

Referring to action 190 in FIG. 1 and semiconductor structure 290 in FIG. 2F, action 190 includes removing portions of the dielectric liner over the semiconductor substrate, and forming a conformal dielectric layer over the vertical gate electrodes and the lateral gate electrodes. Referring to FIG. 2F, semiconductor structure 290 illustrates a cross-sectional view of a portion of a semiconductor structure after completion of action 190 in flowchart 100 of FIG. 1, according to one implementation of the present application. As illustrated in FIG. 2F, semiconductor structure 290 includes dielectric segments 208c, 208d, 208e and 208f under lateral gate electrodes 212a, 212b, 212c and 212d, respectively. Semiconductor structure 290 also includes conformal dielectric layer 214 over lateral gate electrodes 212a, 212b, 212c and 212d, and vertical gate electrodes 210a and 210b. Dielectric segments 208c, 208d, 208e and 208f may be formed by removing portions of dielectric liner 208 not covered by lateral gate electrodes 212a, 212b, 212c and 212d, using an oxide etch, for example. Thereafter, conformal dielectric layer 214 is formed by depositing dielectric material, such as silicon oxide, over lateral gate electrodes 212a, 212b, 212c and 212d, and vertical gate electrodes 210a and 210b. As such, lateral gate structures 216a, 216b, 216c and 216b are formed over semiconductor substrate 201, while vertical gate structures 204a and 204b are formed in semiconductor substrate 201.

Figure 2G:
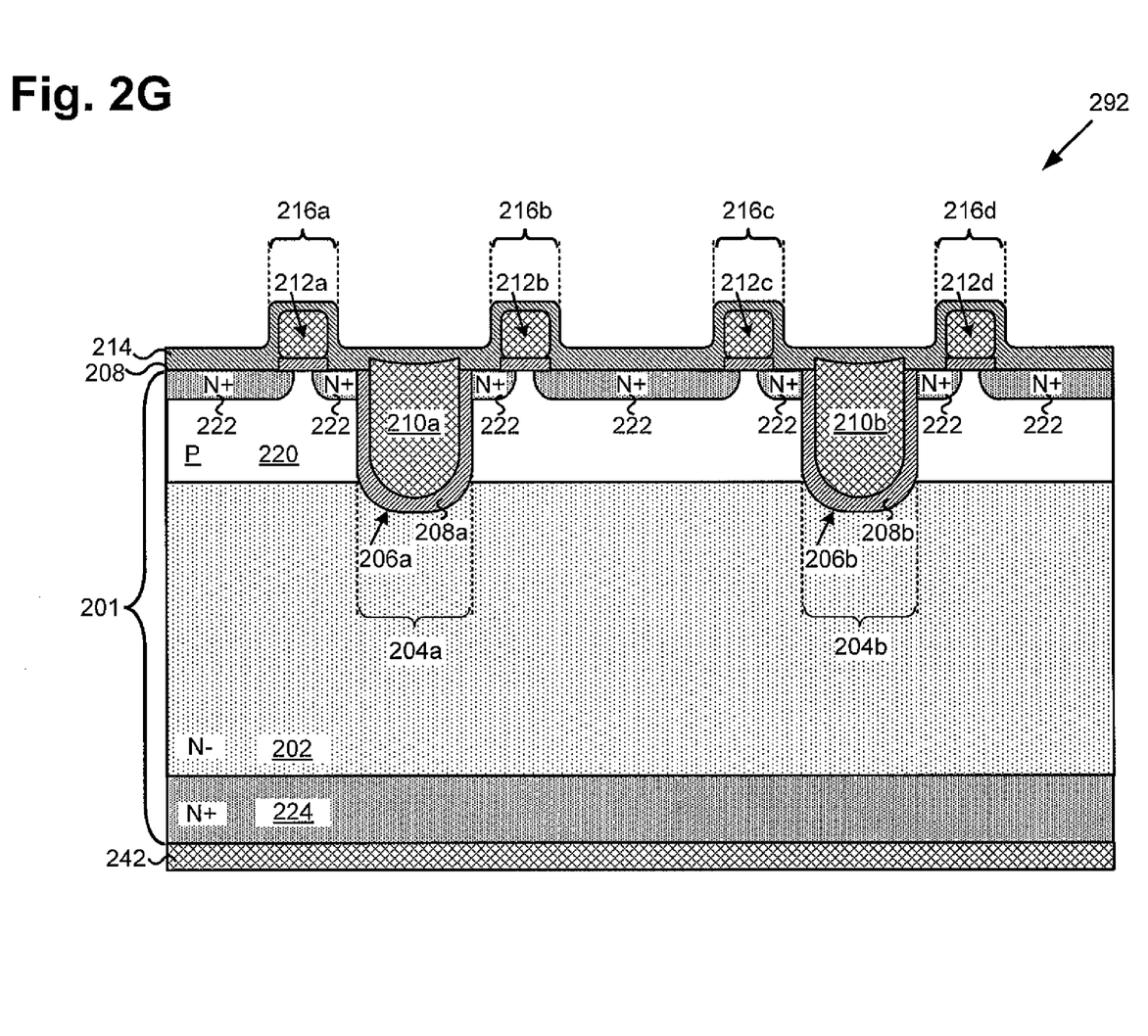
FIG. 2G illustrates a cross-sectional view of a portion of a semiconductor structure processed in accordance with an intermediate action in the flowchart of FIG. 1 according to one implementation of the present application.

Referring to action 192 in FIG. 1 and semiconductor structure 292 in FIG. 2G, action 192 includes forming source regions in the semiconductor substrate. Referring to FIG. 2G, semiconductor structure 292 illustrates a cross-sectional view of a portion of a semiconductor structure after completion of action 192 in flowchart 100 of FIG. 1, according to one implementation of the present application. As illustrated in FIG. 2G, semiconductor structure 292 includes source regions 222 near the top surface of semiconductor substrate 201. Source regions 222 are situated over base region 220 and drift region 202 in semiconductor substrate 201. As illustrated in FIG. 2G, source regions 222 are of the first conductivity type and are shown as having N+ conductivity by way of example. In the present implementation, source regions 222 may be formed, for example, by doping semiconductor substrate 201 using an N type dopant, such as phosphorus or arsenic. In another implementation, source regions 222 may be formed, for example, by doping semiconductor substrate 201 using a P type dopant, such as boron. As illustrated in FIG. 2G, sections of base region 220 under lateral gate electrodes 212a, 212b, 212c and 212d do not receive the source (e.g., N type) dopant, thus remain the conductivity type (e.g., P type) of base region 220. As such, when a gate voltage is applied to lateral gate electrodes 212a, 212b, 212c and 212d, an inversion layer may be formed under each of lateral gate electrodes 212a, 212b, 212c and 212d to allow current to flow. Also, when a gate voltage is applied to vertical gate electrodes 210a and 210b, an inversion layer may be formed along each sidewall of gate trenches 206a and 206b to allow current to flow.

Figure 2H:
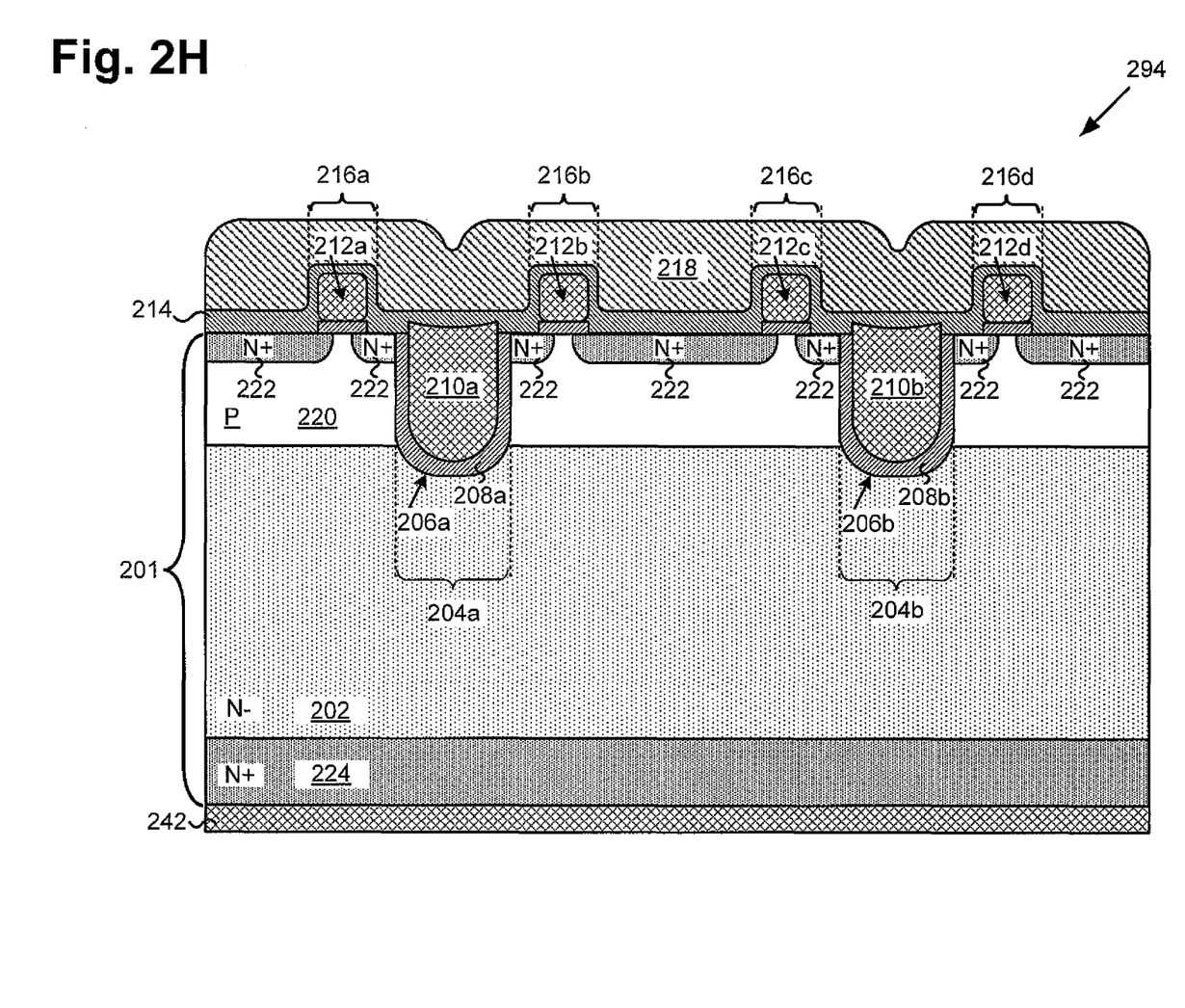
FIG. 2H illustrates a cross-sectional view of a portion of a semiconductor structure processed in accordance with an intermediate action in the flowchart of FIG. 1 according to one implementation of the present application.

Referring to action 194 in FIG. 1 and semiconductor structure 294 in FIG. 2H, action 194 includes forming a gate dielectric capping layer over the semiconductor substrate. Referring to FIG. 2H, semiconductor structure 294 illustrates a cross-sectional view of a portion of a semiconductor structure after completion of action 194 in flowchart 100 of FIG. 1, according to one implementation of the present application. As illustrated in FIG. 2H, semiconductor structure 294 includes gate dielectric capping layer 218 over semiconductor substrate 201. Gate dielectric capping layer 218 is situated over conformal dielectric layer 214, and covers vertical gate electrodes 210a and 210b, and lateral gate electrodes 212a, 212b, 212c and 212d. Gate dielectric capping layer 212 may include any suitable dielectric material, such as silicon oxide or boron phosphate silicate glass (BPSG), to provide insulation for vertical gate electrodes 210a and 210b in gate trenches 206a and 206b, respectively, and lateral gate electrodes 212a, 212b, 212c and 212d over semiconductor substrate 201.

Figure 2I:
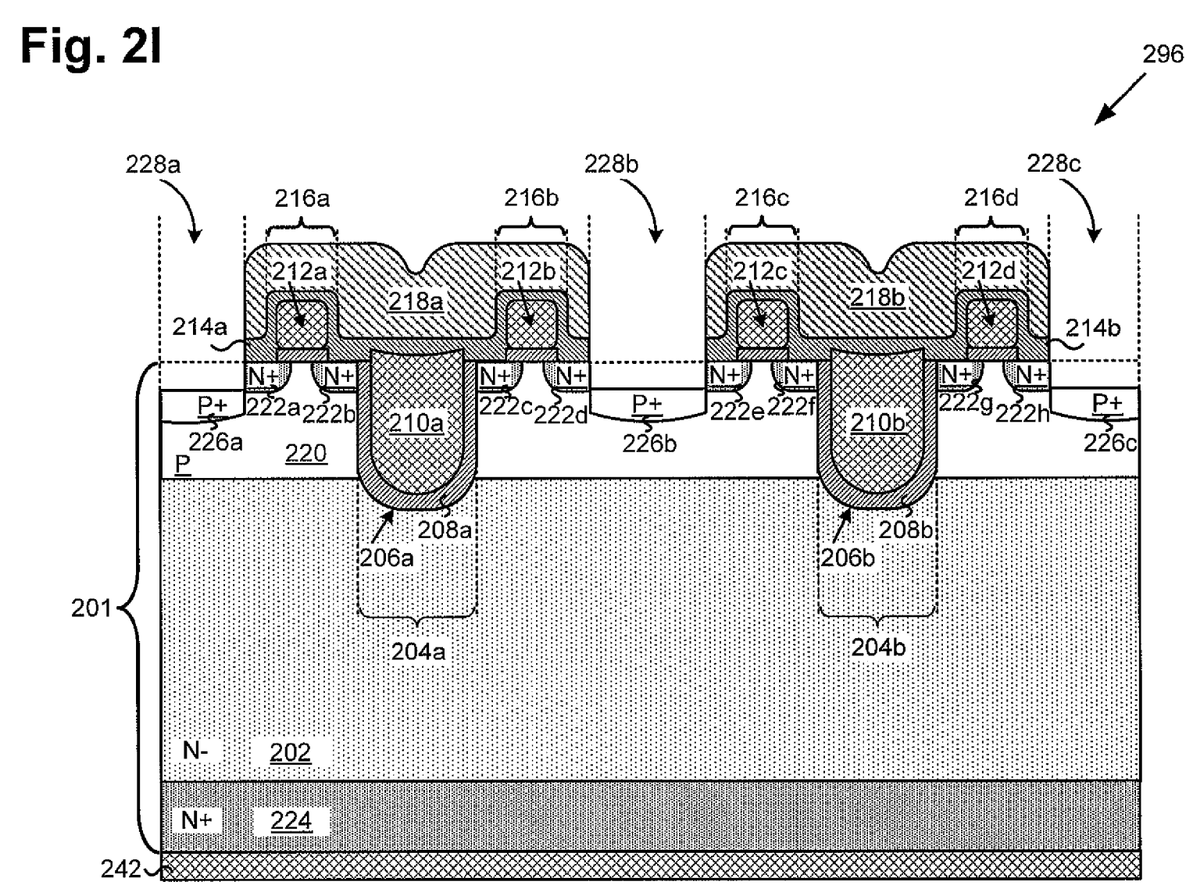
FIG. 2I illustrates a cross-sectional view of a portion of a semiconductor structure processed in accordance with an intermediate action in the flowchart of FIG. 1 according to one implementation of the present application.

Referring to action 196 in FIG. 1 and semiconductor structure 296 in FIG. 2I, action 196 includes forming a contact trench, and forming a body contact in the contact trench. Referring to FIG. 2I, semiconductor structure 296 illustrates a cross-sectional view of a portion of a semiconductor structure after completion of action 196 in flowchart 100 of FIG. 1, according to one implementation of the present application. As illustrated in FIG. 2I, semiconductor structure 296 includes contact trenches' 228a, 228b and 228c, and body contacts 226a, 226b and 226c in semiconductor substrate 201.

As illustrated in FIG. 2I, contact trenches 228a, 228b and 228c each extend through gate dielectric capping layer 218, conformal dielectric layer 214 and source regions 222 that are not immediately adjacent gate trenches 206a and 206b. For example, an oxide etch back may be performed to remove portions of gate dielectric capping layer 212 and conformal dielectric layer 214. Then, an contact etch may be performed to form contact trenches 228a, 228b and 228c by etching through respective source regions 222 to expose base region 220, for example. As a result of forming contact trenches 228a, 228b and 228c, gate dielectric cap 218a is formed over lateral gate structures 216a and 216b and vertical gate structure 204a, while gate dielectric cap 218b is formed over lateral gate structures 216c and 216d, and vertical gate structure 204b. Also, conformal dielectric layers 214a and 214b are segmented from conformal dielectric layer 214 in semiconductor structure 294 in FIG. 2H, where conformal dielectric layer 214a covers lateral gate electrodes 212a and 212b, and where conformal dielectric layer 214b covers lateral gate electrodes 212c and 212d, and vertical gate electrode 210b. As a result of forming contact trenches 228a, 228b and 228c, source regions 222 are segmented into source regions 222a, 222b, 222c, 222d, 222e, 222f, 222g and 222h.

As illustrated in FIG. 2I, semiconductor structure 296 also includes body contacts 226a, 226b and 226c in contact trenches 228a, 228b and 228c, respectively. Body contacts 226a, 226b and 226c are situated near the top surface of semiconductor substrate 201. Body contacts 226a, 226b and 226c are of the second conductivity type and are shown as having P+ conductivity by way of example. In the present implementation, body contacts 226a, 226b and 226c may be formed by implanting a P type dopant, such as boron, in contact trenches 228a, 228b and 228c, respectively. In another implementation, body contacts 226a, 226b and 226c may be formed by implanting an N type dopant, such as phosphorus or arsenic, in contact trenches 228a, 228b and 228c, respectively.

Figure 2J:
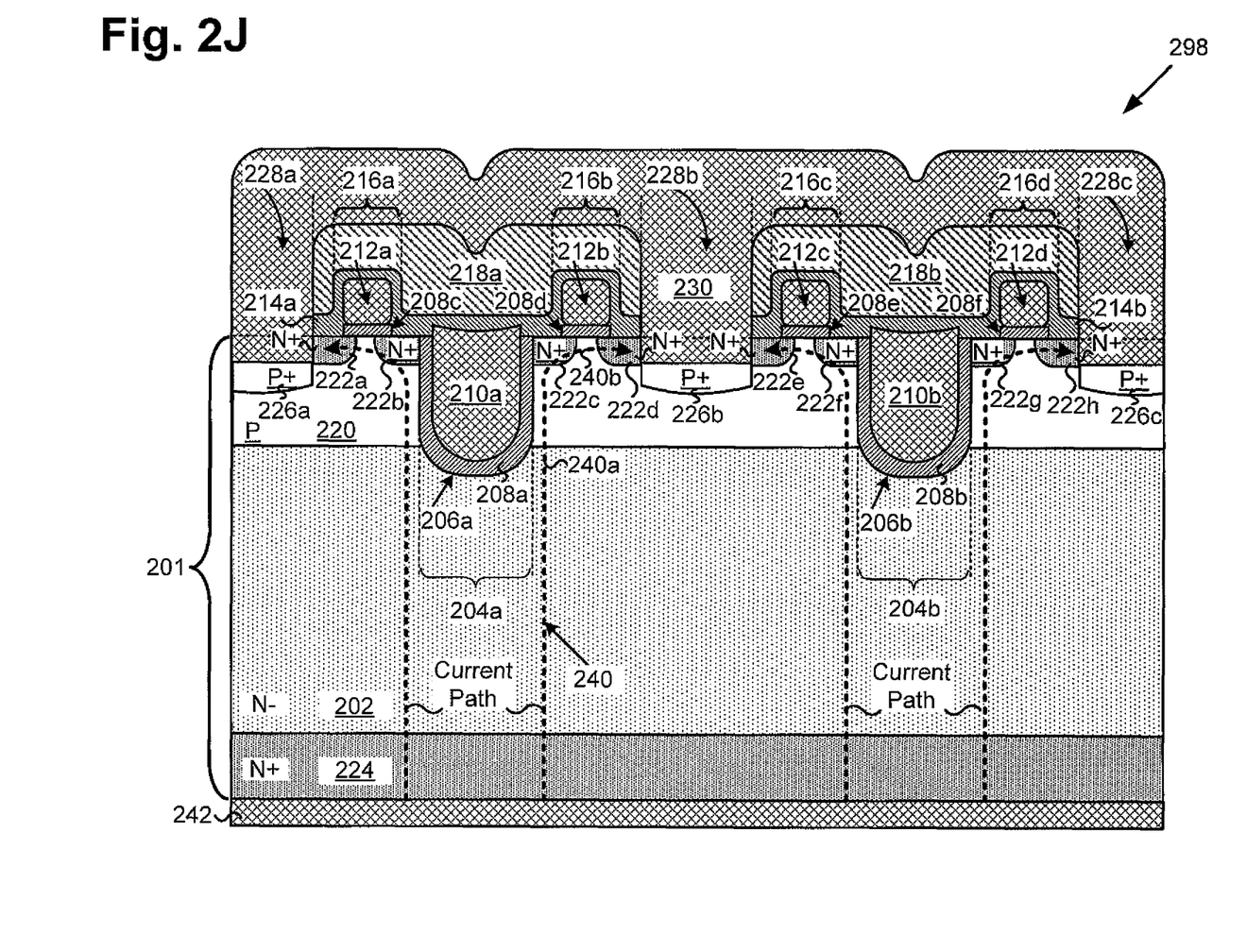
FIG. 2J illustrates a cross-sectional view of a portion of a semiconductor structure processed in accordance with a final action in the flowchart of FIG. 1 according to one implementation of the present application.

Referring to action 198 in FIG. 1 and semiconductor structure 298 in FIG. 2J, action 198 includes forming a source contact in the contact trench. Referring to FIG. 2J, semiconductor structure 298 illustrates a cross-sectional view of a portion of a semiconductor structure after completion of action 198 in flowchart 100 of FIG. 1, according to one implementation of the present application. As illustrated in FIG. 2J, semiconductor structure 298 includes source contact 230 in contact trenches 228a, 228b and 228c.

As illustrated in FIG. 2J, semiconductor structure 298 includes semiconductor substrate 201 having drain region 224, drift region 202, base region 220, source regions 222a, 222b, 222c, 222d, 222e, 222f, 222g and 222h (collectively referred to as "source regions 222"), body contacts 226a, 226b and 226c, source contact 230, and drain contact 242. Semiconductor structure 298 also includes vertical gate structures 204a and 204b in semiconductor substrate 201, and lateral gate structures 216a, 216b, 216c and 216d over semiconductor substrate 201. As illustrated in FIG. 2J, body contacts 226a, 226b and 226c are situated in contact trenches 228a, 228b and 228c, respectively, over base region 220. Source regions 222 are situated near the top surface of semiconductor substrate 201 and over base region 220. Base region 220 is situated over drift region 202, which is situated over drain region 224. In the present implementation, drain region 224, drift region 202, base region 220, source regions 222, and body contacts 226a, 226b and 226c may each include semiconductor material, such as silicon.

In the present implementation, drain region 224 is of the first conductivity type and is shown as having N+ conductivity by way of example. Drift region 202 includes epitaxial silicon grown on drain region 224. Drift region 202 is of the first conductivity type and is shown as having N− conductivity by way of example. Base region 220 is of the second conductivity type and is shown as having P conductivity by way of example. Source regions 222a, 222b, 222c, 222d, 222e, 222f, 222g and 222h are of the first conductivity type and is shown as having N+ conductivity by way of example. Body contacts 226a, 226b and 226c are of the second conductivity type and are shown as having P+ conductivity by way of example. However, in another implementation, drain region 224, drift region 202, base region 220, source regions 222 and body contacts 226a, 226b and 226c may each include the opposite conductivity type, and be formed in various ways without deviating from the scope of the present application.

As illustrated in FIG. 2J, vertical gate structures 204a and 204b are formed in gate trenches 206a and 206b, respectively. Gate trenches 206a and 206b extend through base region 220 and into drift region 202. Gate trenches 206a and 206b each have opposing sidewalls that are substantially parallel to each another (in the present example) and extend into a bottom. In vertical gate structure 204a, vertical gate electrode 210a is situated in gate trench 206a, where dielectric liner 208a is disposed on the sidewalls and the bottom of gate trench 206a. Similarly, in vertical gate structure 204b, vertical gate electrode 210b is situated in gate trench 206b, where dielectric liner 208b is disposed on the sidewalls and the bottom of gate trench 206b. Dielectric liners 208a and 208b may include any suitable dielectric material, such as silicon oxide. Vertical gate electrodes 210a and 210b may include any suitable conductive material, such as doped polycrystalline silicon, metal and/or metal alloy.

As illustrated in FIG. 2J, lateral gate structures 216a, 216b, 216c and 216d are situated over semiconductor substrate 201, where lateral gate electrodes 212a and 212b are adjacent (e.g., on each side of) gate trench 206a, and where lateral gate electrodes 212c and 212d are adjacent (e.g., on each side of) gate trench 206b. Lateral gate electrodes 212a, 212b, 212c and 212d are disposed on dielectric segments 208c, 208d, 208e and 208f, respectively, where lateral gate electrodes 212a and 212b are covered by conformal dielectric layer 214a and gate dielectric cap 218a, while lateral gate electrodes 212c and 212d are covered by conformal dielectric layer 214b and gate dielectric cap 218b. Dielectric segments 208c, 208d, 208e and 208f, conformal dielectric layers 214a and 214b, and gate dielectric caps 218a and 218b may each include any suitable dielectric material, such as silicon oxide. Lateral gate electrodes 212a, 212b, 212c and 212d may include any suitable conductive material, such as doped polycrystalline silicon, metal and/or metal alloy. As discussed above, lateral gate electrodes 212a, 212b, 212c and 212d, and vertical gate electrodes 210a and 210b, may be formed in the same processing action and with the same conductive material. As discussed below, lateral gate electrodes 212a, 212b, 212c and 212d result in improved electrical performance of semiconductor structure 298, such as a MOSFET or an IGBT.

As illustrated in FIG. 2J, source contact 230 is coupled to source regions 222a, 222d, 222e and 222h. Source contact 230 is also coupled to base region 220 through body contacts 226a, 226b and 226c. In the present implementation, source contact 230 may be formed over gate dielectric caps 218a and 218b, and body contacts 226a, 226b and 226c, as a continuous layer. In the present implementation, source contact 230 includes conductive material, such as metal and/or metal alloy. Gate dielectric caps 218a and 218b include dielectric material and electrically insulate vertical gate electrode 210a and lateral gate electrodes 212a and 212b, and vertical gate electrode 210b and lateral gate electrodes 212c and 212d, respectively, from source contact 230.

In the present implementation, source contact 230 is situated on and electrically connected to body contacts 226a, 226b and 226c, source regions 222a, 222d, 222e and 222h, and base region 220. Drain contact 242 is situated below and electrically connected to drain region 224. Source contact 230 and drain contact 242 include conductive material, such as metal and/or metal alloy, and are utilized to form one or more current paths between drain region 224 and source regions 222 during operation of semiconductor structure 298.

As illustrated in FIG. 2J, semiconductor structure 298, such as a MOSFET or an IGBT, includes vertical gate structures 204a and 204b, and lateral gate structures 216a, 216b, 216c and 216d, which are configured to provide respective enhanced current paths, from drain region 224 to respective ones of source regions 222 during operation. For example, enhanced current path 240 includes substantially vertical portion 240a (e.g., traversing drain region 224, drift region 202 and along one of the sidewalls of gate trench 206a) and substantially lateral portion 240b (e.g., traversing source regions 222c and 222d under lateral gate electrode 212b). As illustrated in FIG. 2J, substantially vertical portion 240a traverses, in part, along the sidewall of gate trench 206a, and curves near the top surface of semiconductor substrate 201 towards substantially lateral portion 240b.

It should be noted that lateral gate electrodes 212a, 212b, 212c and 212d, may be coupled to a gate voltage different from that to which vertical gate electrodes 210a and 210b are coupled. By biasing lateral gate electrodes 212a, 212b, 212c and 212d, and vertical gate electrodes 210a and 210b, at different voltages, the curvature of the respective enhanced current paths (e.g., enhanced current path 240), between the respective substantially vertical portions (e.g., substantially vertical portion 240a) and the respective substantially lateral portions (e.g., substantially lateral portion 240b) can be controlled or tuned to suit the specific needs of a particular application. In another implementation, lateral gate electrodes 212a, 212b, 212c and 212d, and vertical gate electrodes 210a and 210b may be coupled to the same gate voltage.

In contrast to conventional trench type semiconductor devices, implementations of the present application utilize a vertical gate structure (e.g., vertical gate structure 204a) in combination of a lateral gate structure (e.g., lateral gate structure 216b) adjacent the vertical gate structure to increase a channel length of the semiconductor device, thereby effectively reducing the risk of high current and/or high electric field crowding at the corners formed by the substantially vertical sidewalls of the gate trenches and the top surface of the semiconductor substrate.

In semiconductor structure 298, if without lateral gate structures 212a, 212b, 212c and 212d, each current path would traverse drift region 202 adjacent the respective bottoms and sidewalls of gate trenches 206a and 206b. High electric fields during an avalanche condition would concentrate near the respective bottoms of gate trenches 206a and 206b. At high temperatures, these high electric fields along with high current densities may result in carriers being injected into dielectric liners 208a and 208b in gate trenches 206a and 206b, respectively. This would cause significant shift of device parameters such as, threshold voltage (Vth), on-resistance $R_{DSon}$, and drain to source leakage (Idss), and can compromise the ruggedness of semiconductor structure 298. However, in semiconductor structure 298, lateral gate structures 216a, 216b, 216c and 216d in combination with vertical gate structures 204a and 204b, are configured to move high impact ionization regions and high electric fields away from gate trenches 206a and 206b, to regions between gate trenches 206a and 206b below body contacts 226a, 226b and 226c, thereby significantly reducing or eliminating the risk of carriers being injected into dielectric liners 208a and 208b to prevent device parameter shift. Thus, lateral gate structures 216a, 216b, 216c and 216d result in substantially reduced impact ionization and electric field under gate trenches 206a and 206b.

Semiconductor structure 298 having enhanced current paths (e.g., enhanced current path 240) can effectively improve thermal stability during operation. For example, the increased channel length of enhanced current path 240 provides an increased heat dissipation path. As such, heat can dissipate not only along substantially vertical portion 240a, but also along substantially lateral portion 240b under lateral gate electrode 212b. As a result, the heat density of semiconductor structure 298 is effectively reduced, as hot spots are spread along the increased channel length of enhanced current path 240. Thus, lateral gate structures 216a, 216b, 216c and 216d result in improved thermal stability in semiconductor structure 298.

As a result of the improved thermal stability in semiconductor structure 298, the forward-bias safe operating area (FBSOA), which defines the region of safe and stable operation of the semiconductor device, is also effectively improved. In contrast to conventional trench type semiconductor devices, where thermal instability occurs when the rate of change of the generated power exceeds the rate of change of the dissipated power, semiconductor structure 298 with enhanced current paths (e.g., enhanced current path 240) can achieve a lower zero temperature coefficient point (ZTCP) and a smaller temperature coefficient dI/dT, which result in a bigger FBSOA.

In addition, semiconductor structure 298 having enhanced current paths (e.g., enhanced current path 240) can significantly improve device energy capability in both forward and reverse biasing conditions, without significantly affecting the DC performance, such as $R_{DSon}$, of semiconductor structure 298. For example, under a forward bias condition, semiconductor structure 298 can sustain a longer charging pulse and achieve a higher clamped inductive switching (CIS) peak current (e.g., 37% higher) than a conventional trench type semiconductor device with comparable trench dimensions, without substantially affecting the DC performance characteristics, such as $R_{DSon}$. Also, during unclamped inductive load switching, semiconductor structure 298 can have a improved avalanche current tolerance (e.g., 10% higher) than a conventional trench type semiconductor device with comparable trench dimensions, without substantially affecting the DC performance characteristics, such as $R_{DSon}$.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present application.

The invention claimed is:

1. A semiconductor device, comprising:
   a drift region of a first conductivity type formed in a semiconductor substrate;
   a base region of a second conductivity type opposite said first conductivity type formed in said semiconductor substrate above said drift region;
   a first vertical gate structure extending through said base region into said drift region;
   a second vertical gate structure extending through said base region into said drift region;
   a first lateral gate structure over said semiconductor substrate between said first vertical gate structure and said second vertical gate structure;
   a second lateral gate structure over said semiconductor substrate between said first lateral gate structure and said second vertical gate structure;
   a source contact over said semiconductor substrate and contacting said base region or a body contact region in said base region between said first lateral gate structure and said second lateral gate structure;

a first source region of said first conductivity type formed in said base region and extending uninterrupted from a sidewall of said first vertical gate structure to under said first lateral gate structure;

a second source region of said first conductivity type formed in said base region and extending uninterrupted from under said first lateral gate structure to said source contact;

a third source region of said first conductivity type formed in said base region and extending uninterrupted from said source contact to under said second lateral gate structure; and a fourth source region of said first conductivity type formed in said base region and extending uninterrupted from under said second lateral gate structure to a sidewall of said second vertical gate structure.

2. The semiconductor device of claim 1, wherein said semiconductor device comprises a MOSFET.

3. A method of forming a semiconductor device, said method comprising:

forming a first vertical gate electrode in a first gate trench in a semiconductor substrate;

forming a first lateral gate electrode over said semiconductor substrate and adjacent said first gate trench;

forming a first source region in said semiconductor substrate which extends uninterrupted from a sidewall of said first gate trench to under said first lateral gate electrode;

forming a second source region in said semiconductor substrate, said second source region being spaced apart from said first source region and extending uninterrupted from under said first lateral gate electrode to a contact trench in said semiconductor substrate; and forming a source contact in said contact trench, said source contact being coupled to said second source region.

4. The method of claim 3, further comprising forming a dielectric liner in said first gate trench.

5. The method of claim 3, wherein said first gate trench extends through a base region into a drift region of said semiconductor substrate.

6. The method of claim 3, further comprising forming a drift region over a drain region in said semiconductor substrate.

7. The method of claim 3, further comprising forming a conformal dielectric layer over said first vertical gate electrode and said first lateral gate electrode.

8. The method of claim 3, further comprising forming a gate dielectric cap over said first vertical gate electrode and said first lateral gate electrode.

9. A method of forming a semiconductor device, said method comprising:

forming a first vertical gate electrode in a first gate trench in a semiconductor substrate;

forming a first lateral gate electrode over said semiconductor substrate and adjacent said first gate trench;

forming a first source region in said semiconductor substrate which extends uninterrupted from a sidewall of said first gate trench to under said first lateral gate electrode;

forming a second vertical gate electrode in a second gate trench in said semiconductor substrate;

forming a second lateral gate electrode over said semiconductor substrate and adjacent said second gate trench;

forming a second source region in said semiconductor substrate which extends uninterrupted from a sidewall of said second gate trench to under said second lateral gate electrode; and forming a source contact between said first lateral gate electrode and said second lateral gate electrode.

10. A semiconductor device, comprising:

a first vertical gate electrode in a first gate trench in a semiconductor substrate;

a first lateral gate electrode over said semiconductor substrate and adjacent said first gate trench;

a first source region in said semiconductor substrate which extends uninterrupted from a sidewall of said first gate trench to under said first lateral gate electrode;

a second source region in said semiconductor substrate, said second source region being spaced apart from said first source region and extending uninterrupted from under said first lateral gate electrode to a contact trench in said semiconductor substrate; and a source contact in said contact trench and being coupled to said second source region.

11. A semiconductor device, comprising:

a first vertical gate electrode in a first gate trench in a semiconductor substrate;

a first lateral gate electrode over said semiconductor substrate and adjacent said first gate trench;

a first source region in said semiconductor substrate which extends uninterrupted from a sidewall of said first gate trench to under said first lateral gate electrode;

a second vertical gate electrode in a second gate trench in said semiconductor substrate;

a second lateral gate electrode over said semiconductor substrate and adjacent said second gate trench;

a second source region in said semiconductor substrate which extends uninterrupted from a sidewall of said second gate trench to under said second lateral gate electrode; and a source contact between said first lateral gate electrode and said second lateral gate electrode.

* * * * *